United States Patent
Lee et al.

(10) Patent No.: US 10,700,190 B2
(45) Date of Patent: Jun. 30, 2020

(54) SEMICONDUCTOR DEVICES AND METHODS FOR MANUFACTURING THE SAME

(71) Applicant: Vanguard International Semiconductor Corporation, Hsinchu (TW)

(72) Inventors: Chia-Hao Lee, New Taipei (TW); Manoj Kumar, Dhanbad (IN); Chang-Xiang Hung, Budai Township (TW); Chih-Cherng Liao, Jhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 27 days.

(21) Appl. No.: 15/877,572

(22) Filed: Jan. 23, 2018

(65) Prior Publication Data
US 2019/0229209 A1  Jul. 25, 2019

(51) Int. Cl.
*H01L 29/778* (2006.01)
*H01L 29/66* (2006.01)
*H01L 29/423* (2006.01)
*H01L 21/30* (2006.01)
*H01L 29/10* (2006.01)
(Continued)

(52) U.S. Cl.
CPC ...... *H01L 29/7786* (2013.01); *H01L 21/0254* (2013.01); *H01L 21/308* (2013.01); *H01L 29/1058* (2013.01); *H01L 29/1066* (2013.01); *H01L 29/66462* (2013.01); *H01L 29/2003* (2013.01)

(58) Field of Classification Search
CPC .................. H01L 29/1058; H01L 29/7786
See application file for complete search history.

(56) References Cited

U.S. PATENT DOCUMENTS

| 2011/0057257 A1* | 3/2011 | Park .................... H01L 29/4236 257/330 |
| 2011/0127540 A1* | 6/2011 | Yamada .............. H01L 29/0657 257/76 |

(Continued)

FOREIGN PATENT DOCUMENTS

| TW | 201301400 A1 | 1/2013 |
| TW | 201427000 A  | 7/2014 |

(Continued)

*Primary Examiner* — Omar F Mojaddedi
(74) *Attorney, Agent, or Firm* — Birch, Stewart, Kolasch & Birch, LLP

(57) ABSTRACT

A semiconductor device includes a first gallium nitride layer disposed on a semiconductor substrate, and an aluminum gallium nitride layer disposed on the first gallium nitride layer. The semiconductor device also includes an upper recess and a lower recess disposed in the aluminum gallium nitride layer, wherein the upper recess adjoins the lower recess, and the upper recess has a width that is greater than that of the lower recess. The semiconductor device further includes a second gallium nitride layer disposed in the first recess and the second recess, and a gate structure disposed on the second gallium nitride layer. In addition, the semiconductor device includes a source electrode and a drain electrode disposed on the aluminum gallium nitride layer.

14 Claims, 5 Drawing Sheets

(51) Int. Cl.
*H01L 21/308* (2006.01)
*H01L 21/02* (2006.01)
*H01L 29/20* (2006.01)

(56) References Cited

U.S. PATENT DOCUMENTS

| 2014/0091316 A1* | 4/2014 | Kikkawa | H01L 29/66462 |
| | | | 257/76 |
| 2014/0097468 A1* | 4/2014 | Okita | H01L 29/42316 |
| | | | 257/192 |
| 2016/0043209 A1* | 2/2016 | Oyama | H01L 29/1029 |
| | | | 257/194 |

FOREIGN PATENT DOCUMENTS

| TW | 201503364 A | 1/2015 |
| TW | 201541636 A | 11/2015 |

\* cited by examiner

SEMICONDUCTOR DEVICES AND METHODS FOR MANUFACTURING THE SAME

BACKGROUND

Field of the Invention

The invention relates to semiconductor devices, and in particular to semiconductor devices having recesses with different depths and methods for manufacturing the same.

Description of the Related Art

Semiconductor devices are used in a variety of electronic applications, such as high-power devices, personal computers, cell phones, digital cameras, and other electronic devices. These semiconductor devices are typically fabricated by depositing an insulating layer or dielectric layer, a conductive layer material, and a semiconductor layer material on the semiconductor substrate, followed by patterning the various material layers by using a photolithography process. Therefore, the circuit devices and components are formed on the semiconductor substrate.

Among these devices, high-electron mobility transistors (HEMTs) have been widely used in the field of high-power applications since they have such advantages as high output power and high breakdown voltage.

Although existing semiconductor devices and methods for manufacturing the same have been adequate for their intended purposes, they have not been entirely satisfactory in all respects. Therefore, up to the present, there are still some problems to be overcome in regards to semiconductor integrated circuits and technology.

BRIEF SUMMARY

Embodiments of semiconductor devices and methods for manufacturing the same are provided, as well as an enhancement-mode (E-mode) high-electron mobility transistor. In some embodiments of the present disclosure, an upper recess and a lower recess are disposed in an aluminum gallium nitride layer, and a gallium nitride layer is filled in the upper recess and the lower recess. Specifically, the upper recess is adjacent to the lower recess, and the width of the upper recess is greater than the width of the lower recess. As a result, the bottom surface of the gallium nitride layer is step-shaped. That is, the gallium nitride layer has at least two different thicknesses, such that the threshold voltage of the semiconductor device can be easily and precisely controlled without affecting the breakdown voltage of the semiconductor device. Moreover, the threshold voltage can be controlled without adding any additional implantation processes.

Some embodiments of the disclosure provide a semiconductor device. The semiconductor device includes a first gallium nitride layer disposed on a semiconductor substrate, and an aluminum gallium nitride layer disposed on the first gallium nitride layer. The semiconductor device also includes an upper recess and a lower recess disposed in the aluminum gallium nitride layer, wherein the upper recess adjoins the lower recess, and the upper recess has a width that is greater than that of the lower recess. The semiconductor device further includes a second gallium nitride layer disposed in the first recess and the second recess, and a gate structure disposed on the second gallium nitride layer. In addition, the semiconductor device includes a source electrode and a drain electrode disposed on the aluminum gallium nitride layer.

Some embodiments of the disclosure provide a semiconductor device. The semiconductor device includes a first gallium nitride layer disposed on a semiconductor substrate, and an aluminum gallium nitride layer disposed on the first gallium nitride layer. The semiconductor device also includes a first recess and a second recess disposed in the aluminum gallium nitride layer, wherein the first recess laterally adjoin the second recess, and the second recess has a depth that is greater than that of the first recess. The semiconductor device further includes a second gallium nitride layer disposed in the first recess and the second recess, and a gate structure disposed on the second gallium nitride layer. In addition, the semiconductor device includes a source electrode and a drain electrode disposed on the aluminum gallium nitride layer.

Some embodiments of the disclosure provide a method for manufacturing a semiconductor device. The method includes forming a first gallium nitride layer on a semiconductor substrate, and forming an aluminum gallium nitride layer on the first gallium nitride layer. The method also includes forming an upper recess in the aluminum gallium nitride layer, and forming a lower recess in the aluminum gallium nitride layer through the upper recess, wherein the upper recess has a width that is greater than that of the lower recess. The method further includes forming a second gallium nitride layer in the lower recess and the upper recess, and forming a gate structure on the second gallium nitride layer. In addition, the method includes forming a source electrode and a drain electrode on the aluminum gallium nitride layer.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
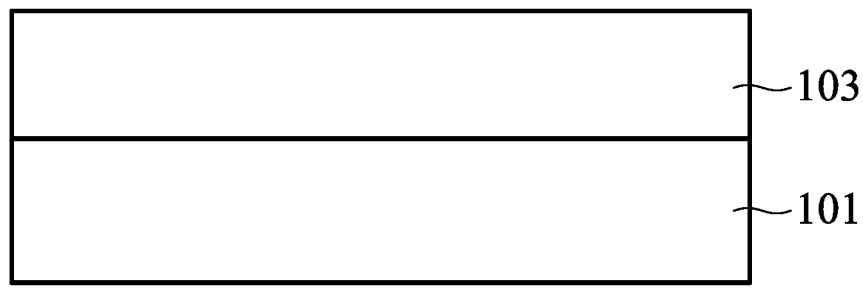
FIGS. 1A to 1H are cross-sectional views illustrating intermediate stages of a method for manufacturing a semiconductor device of FIG. 1H in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like elements. It should be understood that additional operations can be provided before, during, and after the method, and some of the operations described can be replaced or eliminated for other embodiments of the method.

Figure 1B:
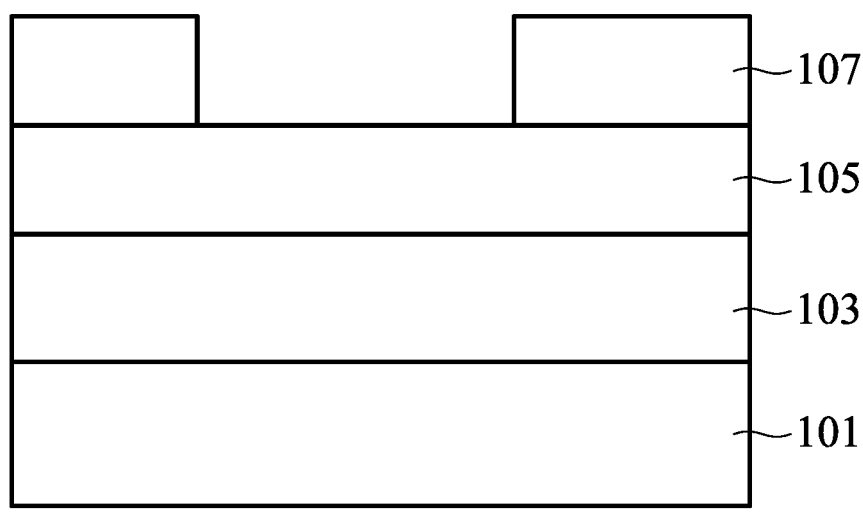
Figure 1C:
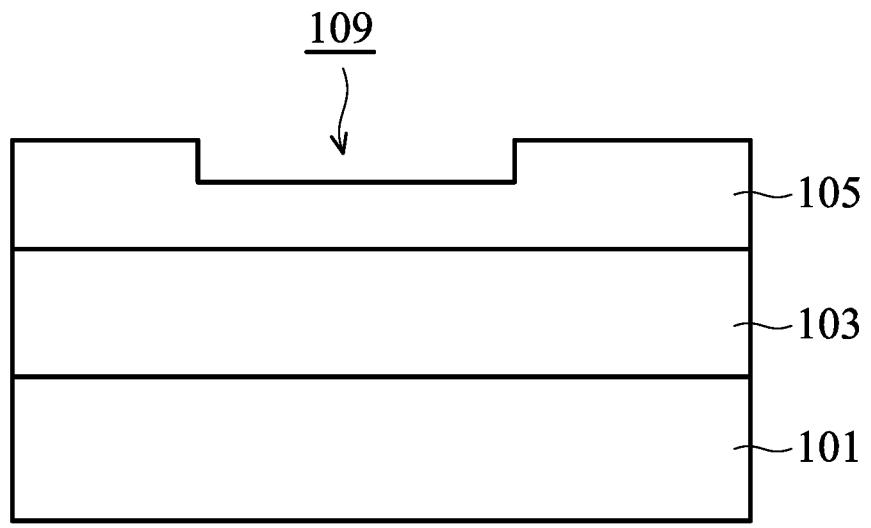
Figure 1D:
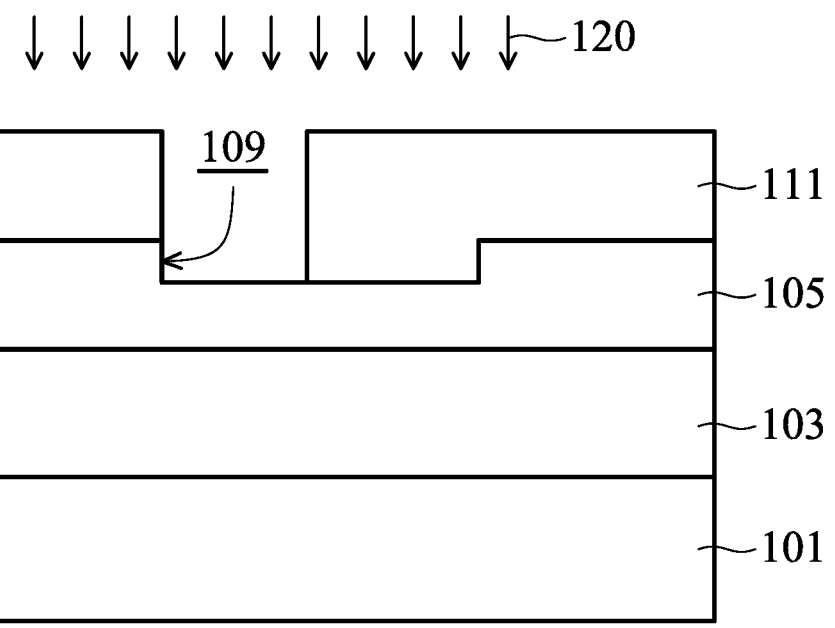
Figure 1E:
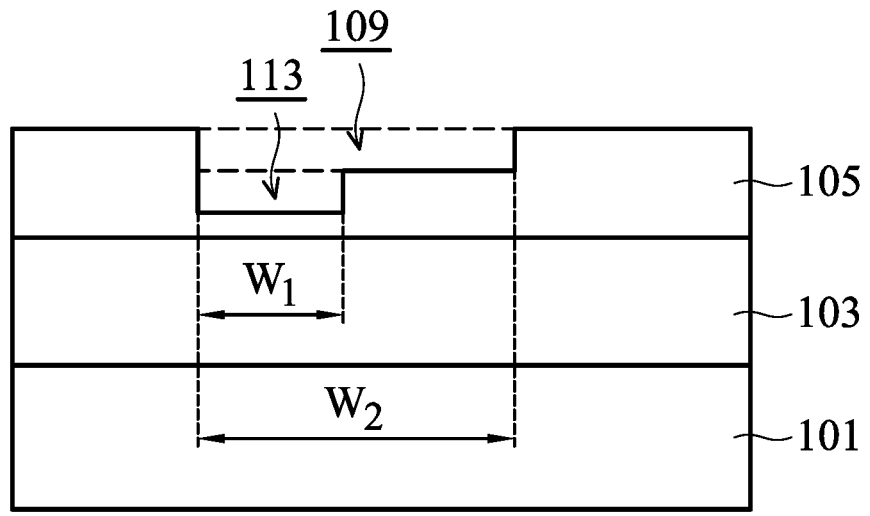
Figure 1F:
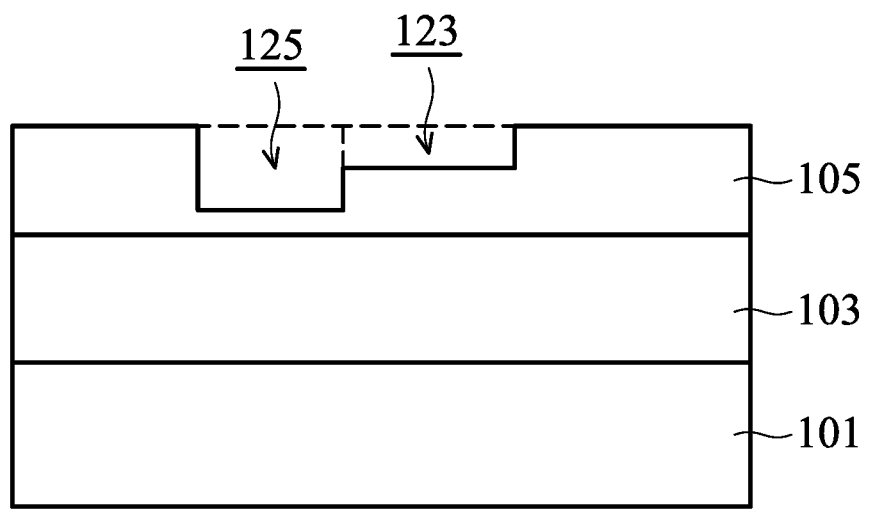
Figure 1G:
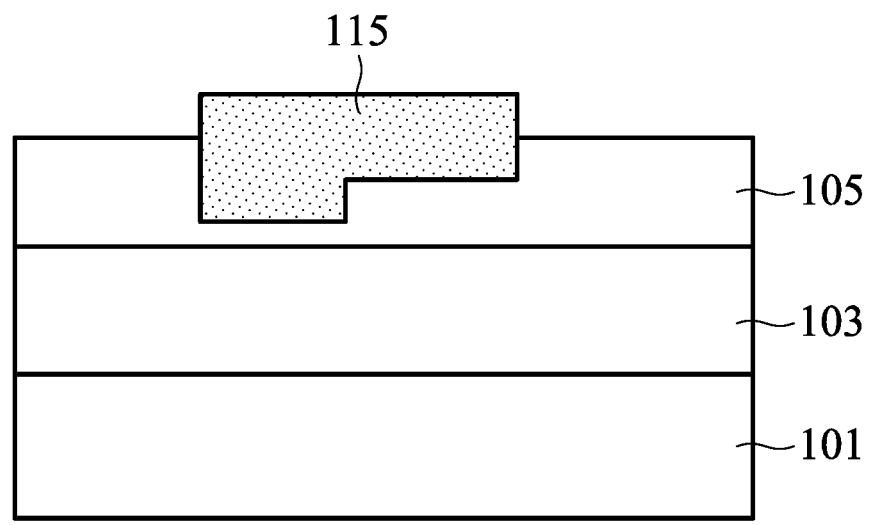
Figure 1H:
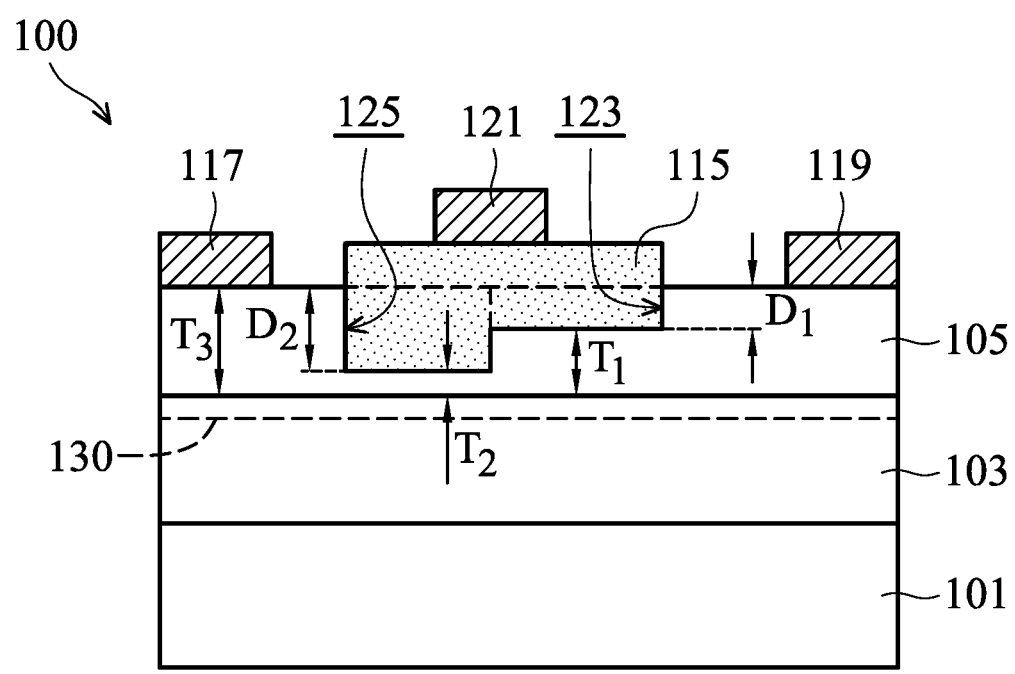

FIGS. 1A to 1H are cross-sectional views illustrating intermediate stages of a method for manufacturing a semiconductor device 100 of FIG. 1H in accordance with some embodiments. As shown in FIG. 1A, a gallium nitride layer 103 (also referred to as a first gallium nitride layer) is formed on a semiconductor substrate 101. In some embodiments, the semiconductor substrate 101 may be made of silicon (Si), silicon carbide (SiC), gallium nitride (GaN), silicon dioxide ($SiO_2$), sapphire, or a combination thereof.

Moreover, the gallium nitride layer 103 is undoped. In some embodiments, the gallium nitride layer 103 may be formed by using a metal organic chemical vapor deposition (MOCVD) process, a molecular beam epitaxy (MBE) process, or a combination thereof. In some embodiments, the gallium nitride layer 103 may be a multi-layer structure.

As shown in FIG. 1B, in accordance with some embodiments, an aluminum gallium nitride layer 105 is formed on the gallium nitride layer 103, and a patterned mask 107 is formed on the aluminum gallium nitride layer 105. Some processes used to form the aluminum gallium nitride layer 105 are similar to, or the same as, those used to form the gallium nitride layer 103, and are not repeated herein. In some embodiments, the thickness of the aluminum gallium nitride layer 105 is in a range from about 20 nm to about 35 nm, especially about 25 nm. Moreover, in the embodiment, the aluminum gallium nitride layer 105 is undoped.

In some embodiments, a mask layer (not shown) is formed on the aluminum gallium nitride layer 105. Then, the mask layer is patterned by performing a patterning process to form the patterned mask 107. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process. As a result, a portion of the aluminum gallium nitride layer 105 is exposed by the patterned mask 107.

Then, referring to FIGS. 1B and 1C, an etching process 110 is performed, and an upper recess 109 is formed in the aluminum gallium nitride layer 105 by using the patterned mask 107 as the mask. It is important to note that the upper recess 109 is not penetrating through the aluminum gallium nitride layer 105. In other words, the gallium nitride layer 103 is not exposed by the upper recess 109. The patterned mask 107 is removed after the upper recess 109 is formed.

In some embodiments, before the etching process 110 is performed, the thickness of the aluminum gallium nitride layer 105 is about 25 nm, and the depth of the upper recess 109 is in a range from about 5 nm to about 10 nm after the etching process 110. That is, the thickness of the aluminum gallium nitride layer 105 under the upper recess 109 is in a range from about 15 nm to about 20 nm.

As shown in FIG. 1D, a patterned mask 111 is formed on the aluminum gallium nitride layer 105, in accordance with some embodiments. Specifically, the patterned mask 111 is extended into the upper recess 109. A portion of the upper recess 109 is filled by the patterned mask 111 with the other portion of the upper recess 109 remains empty. In some embodiments, one of the sidewalls of the upper recess 109 is aligned with a sidewall of the patterned mask 111 thereon. Some materials and processes used to form the patterned mask 111 are similar to, or the same as, those used to form the patterned mask 107, and are not repeated herein.

Next, referring to FIGS. 1D and 1E, an etching process 120 is performed, and a lower recess 113 is formed in the aluminum gallium nitride layer 105 through the upper recess 109 by using the patterned mask 111 as the mask. The upper recess 109 adjoins the lower recess 113. In some embodiments, the upper recess 109 has a sidewall aligned with a sidewall of the lower recess 113. Specifically, the lower recess 113 has a width W1, the upper recess 109 has a width W2, and the width W2 is greater than the width W1. In some embodiments, the width W1 and the width W2 can be adjusted to meet manufacturing requirements.

It is important to note that the lower recess 113 is not penetrating through the aluminum gallium nitride layer 105. In other words, the gallium nitride layer 103 is not exposed by the lower recess 113. After the lower recess 113 is formed, the patterned mask 111 is removed, and a portion of the aluminum gallium nitride layer 105, which is located under the upper recess 109 and the lower recess 113, has a step-shaped top surface.

In other words, the combination of the upper recess 109 and the lower recess 113 can be divided into a first recess 123 and a second recess 125 (as shown in FIG. 1F). The first recess 123 laterally adjoins the second recess 125, and the depth of the second recess 125 is greater than the depth of the first recess 123.

Next, as shown in FIG. 1G, a gallium nitride layer 115 (also referred to as a second gallium nitride layer) is filled in the upper recess 109 and the lower recess 113 (i.e., the gallium nitride layer 115 is filled in the first recess 123 and the second recess 125). In some embodiments, the gallium nitride layer 115 protrudes from the aluminum gallium nitride layer 105. In other words, the top surface of the gallium nitride layer 115 is higher than the top surface of the aluminum gallium nitride layer 105.

In some embodiments, the gallium nitride layer 115 may be formed by using a chemical vapor deposition (CVD) process, a metal organic chemical vapor deposition process, a molecular beam epitaxy process, or a combination thereof. In some embodiments, the gallium nitride layer 115 is p-type.

Moreover, the bottom surface of the gallium nitride layer 115 is step-shaped, and the gallium nitride layer 103 and the gallium nitride layer 115 are separated by a portion of the aluminum gallium nitride layer 105. In other words, the bottommost surface of the gallium nitride layer 115 is higher than the topmost surface of the gallium nitride layer 103.

Next, as shown in FIG. 1H, a source electrode 117 and a drain electrode 119 are formed on the aluminum gallium nitride layer 105, and a gate structure 121 is formed on the gallium nitride layer 115. In some embodiments, the source electrode 117, the drain electrode 119 and the gate structure 121 are made of conductive materials, such as aluminum (Al), copper (Cu), tungsten (W), titanium (Ti), tantalum (Ta), titanium nitride (TiN), or other applicable materials. In some embodiments, the source electrode 117, the drain electrode 119 and the gate structure 121 are formed by a deposition process and a patterning process. The deposition process may be a chemical vapor deposition process, a physical vapor deposition (PVD) process, an atomic layer deposition (ALD) process, a high density plasma chemical vapor deposition (HDPCVD) process, a metal organic chemical vapor deposition process, a plasma enhanced chemical vapor deposition (PECVD) process, or a combination thereof.

In the embodiment, the semiconductor device 100 is completed after the source electrode 117, the drain electrode 119 and the gate structure 123 are formed, and a two-dimensional electron gas (2DEG) channel 130 is generated. The two-dimensional electron gas channel 130 may be generated in the gallium nitride layer 103 and may extend along the interface between the gallium nitride layer 103 and the aluminum gallium nitride layer 105.

Specifically, the source electrode 117 is closer to the lower recess 113 than the drain electrode 119. That is, the source electrode 117 is closer to the second recess 125 than the drain electrode 119. In some embodiments, the interface between the first recess 123 and the second recess 125 is covered by the gate structure 121. In addition, the bottom surface of the gate structure 121 is higher than the bottom surface of the source electrode 117 and the bottom surface of the drain electrode 119.

It is important to note that the aluminum gallium nitride layer 105 has a first thickness T1 under the first recess 123, a second thickness T2 under the second recess 125, and a third thickness T3 under the source electrode 117, and the third thickness T3 is greater than the first thickness T1, the first thickness T1 is greater than the second thickness T2. In some embodiments, a first ratio of the first thickness T1 to the third thickness T3 is in a range from about 0.6 to about 0.8, and a second ratio of the second thickness T2 to the third thickness T3 is in a range from about 0.2 to about 0.4.

Moreover, in some embodiments, the third thickness T3 is about 25 nm, the first thickness T1 is in a range from about 15 nm to about 20 nm, and the second thickness T2 is in a range from about 5 nm to about 10 nm. To sum up, the portion of the aluminum gallium nitride layer 105 under the gallium nitride layer 115 has two different thicknesses. In other embodiments, the gallium nitride layer 115 may have more than two thicknesses.

Furthermore, the threshold voltage of the semiconductor device 100 is positively correlated with the second thickness T2. Specifically, the threshold voltage of the semiconductor device 100 is increased when the second thickness T2 is increased. Therefore, the threshold voltage of the semiconductor device 100 can be easily and precisely controlled without affecting the breakdown voltage of the semiconductor device 100. Moreover, the threshold voltage can be controlled without adding additional implantation processes.

Figure 2:
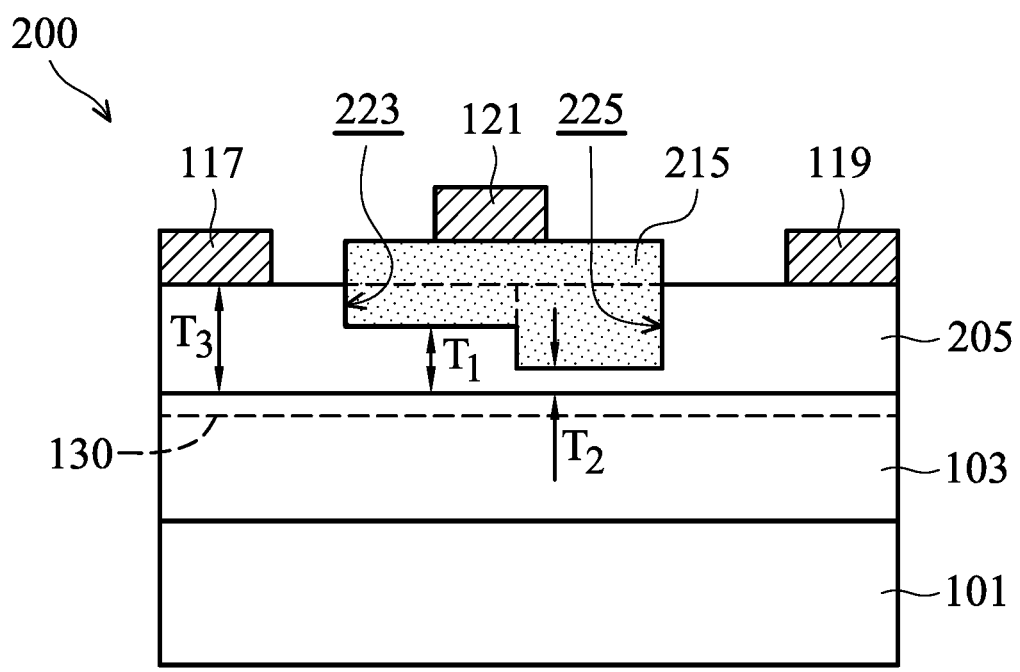
FIG. 2 is a cross-sectional view of a semiconductor device of FIG. 2 in accordance with some other embodiments.

FIG. 2 is a cross-sectional view of a semiconductor device 200 of FIG. 2 in accordance with some other embodiments. The difference between the semiconductor device 200 and the semiconductor device 100 is the positions of the recesses.

The semiconductor device 200 includes an aluminum gallium nitride layer 205. Some materials and processes used to form the aluminum gallium nitride layer 205 are similar to, or the same as, those used to form the aluminum gallium nitride layer 105 of the semiconductor device 100, and are not repeated herein. In addition, the semiconductor device 200 includes a first recess 223 and a second recess 225. Some processes used to form the first recess 223 and the second recess 225 are similar to, or the same as, those used to form the first recess 123 and the second recess 125 (i.e. the upper recess 109 and the lower recess 113) of the semiconductor device 100, and are not repeated herein. However, the first recess 223 of the semiconductor device 200 is closer to the source electrode 117 than the second recess 225, which is different from the semiconductor device 100.

The first thickness T1 of the aluminum gallium nitride layer 205 in the semiconductor device 200 is closer to the source electrode 117 than the first thickness T1 of the aluminum gallium nitride layer 105 in the semiconductor device 100.

Semiconductor devices, for example, enhancement-mode high-electron mobility transistors, and methods for forming the same are provided in the present disclosure. In some embodiments, an upper recess and a lower recess are disposed in an aluminum gallium nitride layer, and a gallium nitride layer is filled in the upper recess and the lower recess. Specifically, the upper recess adjoins the lower recess, and the width of the upper recess is greater than the width of the lower recess. As a result, the bottom surface of the gallium nitride layer is step-shaped. That is, the gallium nitride layer has at least two different thicknesses, such that the threshold voltage of the semiconductor device can be easily and precisely controlled without affecting the breakdown voltage of the semiconductor device. Moreover, the threshold voltage can be controlled without adding additional implantation processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first gallium nitride layer disposed on a semiconductor substrate;
    an aluminum gallium nitride layer disposed on the first gallium nitride layer;
    an upper recess and a lower recess disposed in the aluminum gallium nitride layer, wherein the upper recess adjoins the lower recess, and the upper recess has a width that is greater than that of the lower recess;
    a second gallium nitride layer disposed in the upper recess and the lower recess, wherein the second gallium nitride layer and the first gallium nitride layer are separated by a portion of the aluminum gallium nitride layer, and the portion of the aluminum gallium nitride layer has a first thickness under the upper recess, a second thickness under the lower recess, and a third thickness under a source electrode, and wherein a first ratio of the first thickness to the third thickness is in a range from 0.6 to 0.8, and a second ratio of the second thickness to the third thickness is in a range from 0.2 to 0.4;
    a gate structure disposed on the second gallium nitride layer; and
    the source electrode and a drain electrode disposed on the aluminum gallium nitride layer, wherein the aluminum gallium nitride layer extends from the source electrode to the drain electrode and has a flat bottom surface, and the second gallium nitride layer has a first sidewall closest to the drain electrode and a second sidewall closest to the source electrode, wherein a first length of the first sidewall is smaller than a second length of the second sidewall.

2. The semiconductor device as claimed in claim 1, wherein the first gallium nitride layer and the aluminum gallium nitride layer are undoped, and the second gallium nitride layer is p-type.

3. The semiconductor device as claimed in claim 1, wherein a bottom surface of the second gallium nitride layer is step-shaped.

4. The semiconductor device as claimed in claim 1, wherein the source electrode is closer to the lower recess than the drain electrode.

5. The semiconductor device as claimed in claim 1, wherein the drain electrode is closer to the lower recess than the source electrode.

6. The semiconductor device as claimed in claim 1, wherein the upper recess has a sidewall aligned with a sidewall of the lower recess.

7. The semiconductor device as claimed in claim 1, wherein the second gallium nitride layer protrudes from the aluminum gallium nitride layer, and the gate structure has a bottom surface that is higher than that of the source electrode and the drain electrode.

8. The semiconductor device as claimed in claim 1, wherein the second gallium nitride layer does not cover a top surface of the aluminum gallium nitride layer.

9. A method for manufacturing the semiconductor device as set forth in claim 1, comprising:
    forming the first gallium nitride layer on the semiconductor substrate;
    forming the aluminum gallium nitride layer on the first gallium nitride layer;
    forming the upper recess in the aluminum gallium nitride layer;
    forming the lower recess in the aluminum gallium nitride layer through the upper recess, wherein the upper recess adjoins the lower recess, and the upper recess has a width that is greater than that of the lower recess;
    forming the second gallium nitride layer in the lower recess and the upper recess;
    forming the gate structure on the second gallium nitride layer; and
    forming the source electrode and the drain electrode on the aluminum gallium nitride layer.

10. The method as claimed in claim 9, wherein the first gallium nitride layer and the aluminum gallium nitride layer are undoped, and the second gallium nitride layer is p-type.

11. The method as claimed in claim 9, wherein the source electrode is closer to the lower recess than the drain electrode.

12. The method as claimed in claim 9, wherein a bottommost surface of the second gallium nitride layer is higher than a topmost surface of the first gallium nitride layer.

13. The method as claimed in claim 9, wherein a top surface of the second gallium nitride layer is higher than a top surface of the aluminum gallium nitride layer.

14. The method as claimed in claim 9, wherein the forming the lower recess in the aluminum gallium nitride layer through the upper recess further comprises:
    forming a patterned mask on the aluminum gallium nitride layer, wherein a portion of the patterned mask is filled in the upper recess; and
    removing a portion of the aluminum gallium nitride layer exposed by the patterned mask by performing an etching process to form the lower recess.

\* \* \* \* \*